United States Patent
Ishihara (10) Patent No.: US 12,038,140 B2
(45) Date of Patent: Jul. 16, 2024

(54) OPTICAL LIGHT EMITTING DEVICE, MANUFACTURING METHOD THEREOF, AND OPTICAL LIGHT EMITTING ELEMENT

(71) Applicant: Japan Display Inc., Tokyo (JP)

(72) Inventor: Tomoyuki Ishihara, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 18/230,522

(22) Filed: Aug. 4, 2023

(65) Prior Publication Data

US 2024/0044458 A1    Feb. 8, 2024

(30) Foreign Application Priority Data

Aug. 8, 2022  (JP) ................. 2022-126141

(51) Int. Cl.
| | |
|---|---|
| *F21K 9/237* | (2016.01) |
| *F21K 9/232* | (2016.01) |
| *F21V 19/00* | (2006.01) |
| *H05K 3/30* | (2006.01) |
| *H05K 3/34* | (2006.01) |

(Continued)

(52) U.S. Cl.
CPC ............... *F21K 9/232* (2016.08); *F21K 9/237* (2016.08); *F21V 19/005* (2013.01); *H05K 3/303* (2013.01); *H05K 3/3415* (2013.01); *F21Y 2107/40* (2016.08); *F21Y 2115/10* (2016.08)

(58) Field of Classification Search
CPC ........ F21K 9/232; F21K 9/237; F21V 19/005; H05K 3/303; H05K 3/3415; H05K 1/182; H05K 1/183; H05K 1/184; H05K 2201/10295; H05K 2201/10303; H05K 3/325; H05K 3/341; F21Y 2107/40; F21Y 2115/10; F21Y 2107/00
See application file for complete search history.

(56) References Cited

U.S. PATENT DOCUMENTS

2009/0268434 A1 * 10/2009 Mita ................. G02F 1/133608
                                                                  362/382

FOREIGN PATENT DOCUMENTS

| EP | 2760058 A1 * | 7/2014 | ............... F21K 9/23 |
| JP | 2002358022 A | 12/2002 | |
| KR | 20190105341 A * | 9/2019 | |

OTHER PUBLICATIONS

Search English translation of Kim (Year: 2019).*
Search English translation of Imai (Year: 2014).*

* cited by examiner

Primary Examiner — Omar Rojas Cadima
(74) Attorney, Agent, or Firm — K&L Gates LLP (57) ABSTRACT

To provide a technology capable of improving efficiency in a mounting process of disposing a large number of identical parts such as LED elements on a circuit board. An optical light emitting device includes: packages of a plurality of regular polyhedra each having a light emitting element; and a board having a plurality of mounting holes fitted with three surfaces of the regular polyhedral packages. In the optical light emitting device, the exterior of each of the regular polyhedra in the regular polyhedral packages is comprised of a transparent member. Each of the regular polyhedral packages includes: first electrodes each provided at each top; and second electrodes each provided on a straight line connecting the two tops, each of the first electrodes is connected to one electrode of the light emitting element, and each of the second electrodes is connected to the other electrode of the light emitting element.

20 Claims, 11 Drawing Sheets

(51) Int. Cl.
*F21Y 107/40* (2016.01)
*F21Y 115/10* (2016.01)

OPTICAL LIGHT EMITTING DEVICE, MANUFACTURING METHOD THEREOF, AND OPTICAL LIGHT EMITTING ELEMENT

CLAIM OF PRIORITY

The present application claims priority from Japanese Patent Application JP 2022-126141 filed on Aug. 8, 2022, the content of which is hereby incorporated by reference into this application.

BACKGROUND OF THE INVENTION

The present invention relates to an optical light emitting device such as a display device or a lighting device, a manufacturing method thereof, and an optical light emitting element.

There have been known a display device (also called an LED display), a lighting device, etc. using a plurality of LED (Lighting Emitting Diode) elements as optical light emitting elements. For example, in a display device using a plurality of LEDs, the LEDs are mounted on a circuit board.

As a proposal for a display device using a plurality of LED chips, there has been known, for example, Japanese Unexamined Patent Application Publication No. 2002-358022.

SUMMARY OF THE INVENTION

In a mass mounting process of the same parts (LED elements) such as LED displays or the like, for example, mounting work is performed in which LED elements as parts are picked up one by one by a mounter device and placed on a circuit board.

Due to this mounting work, the time required for the mounting process is lengthened, resulting in problems such as restrictions on the product production quality and an increase in the generation rate of mounting defects.

It is an object of the present invention to provide a technology capable of improving efficiency in a mounting process of disposing a large number of identical parts such as LED elements on a circuit board.

Other subjects and novel features will become apparent from the description of the present specification and the accompanying drawings.

In this invention, typical ones of summary are briefly described as follows.

That is, an optical light emitting device of this embodiment includes: packages of a plurality of regular polyhedra each having a light emitting element; and a board having a plurality of mounting holes fitted with three surfaces of the regular polyhedral packages. In the optical light emitting device, the exterior of each of the regular polyhedra in the regular polyhedral packages is comprised of a transparent member, each of the regular polyhedral packages includes: first electrodes each provided at each top; and second electrodes each provided on a straight line connecting the two tops, each of the first electrodes is connected to one electrode of the light emitting element, and each of the second electrodes is connected to the other electrode of the light emitting element.

Further, a method of manufacturing the optical light emitting device according to this embodiment, includes: a first step of scattering the regular polyhedral packages on the board in a number greater than the number of the mounting holes; a second step of vibrating the board; a third step of blowing off the regular polyhedral packages unfitted or free from fitting in the mounting holes to recover the packages; and a fourth step of fixing the first electrodes and second electrodes of the regular polyhedral packages fitted into the mounting holes and wirings on the board by solder.

Further, an optical light emitting element of this embodiment includes: a light emitting element; and a package of a translucent regular polyhedron storing the light emitting element therein. In the optical light emitting element, a first electrode is provided at each of tops of the regular polyhedral package, a second electrode is provided on each of straight lines each connecting the two tops of the regular polyhedral package, the first electrodes are connected to one electrode of the light emitting element, and the second electrodes are connected to the other electrode of the light emitting element.

DETAILED DESCRIPTION OF THE PREFERRED EMBODIMENTS

Preferred embodiments of the present invention will hereinafter be described with reference to the accompanying drawings.

It should be noted that the present disclosure is merely an example, and those skilled in the art will naturally include within the scope of the present invention, any appropriate modifications that can be easily conceived while maintaining the gist of the invention. Further, in order to make the description clearer, the drawings may schematically show the width, thickness, shape, etc. of each part as compared to the actual aspect, but this is only an example and is not intended to limit the interpretation of the present invention.

Further, in the present specification and each drawing, the same reference numerals may be given to the same elements as those described above in terms of the already-mentioned figures, and detailed description thereof may be omitted as appropriate.

Embodiments (Overall Configuration Example of Optical Light Emitting Device)

Figure 1:
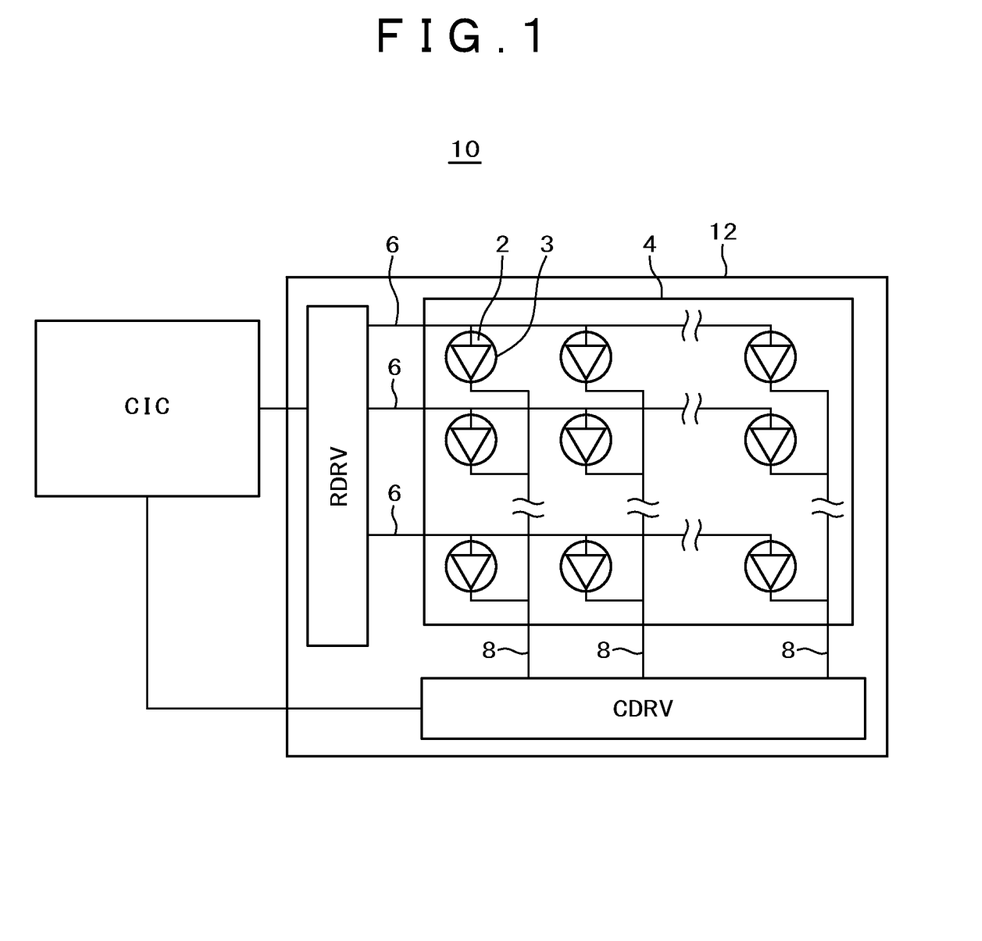
FIG. 1 is a view conceptually showing an overall configuration example of an optical light emitting device according to an embodiment.
Figure 2:
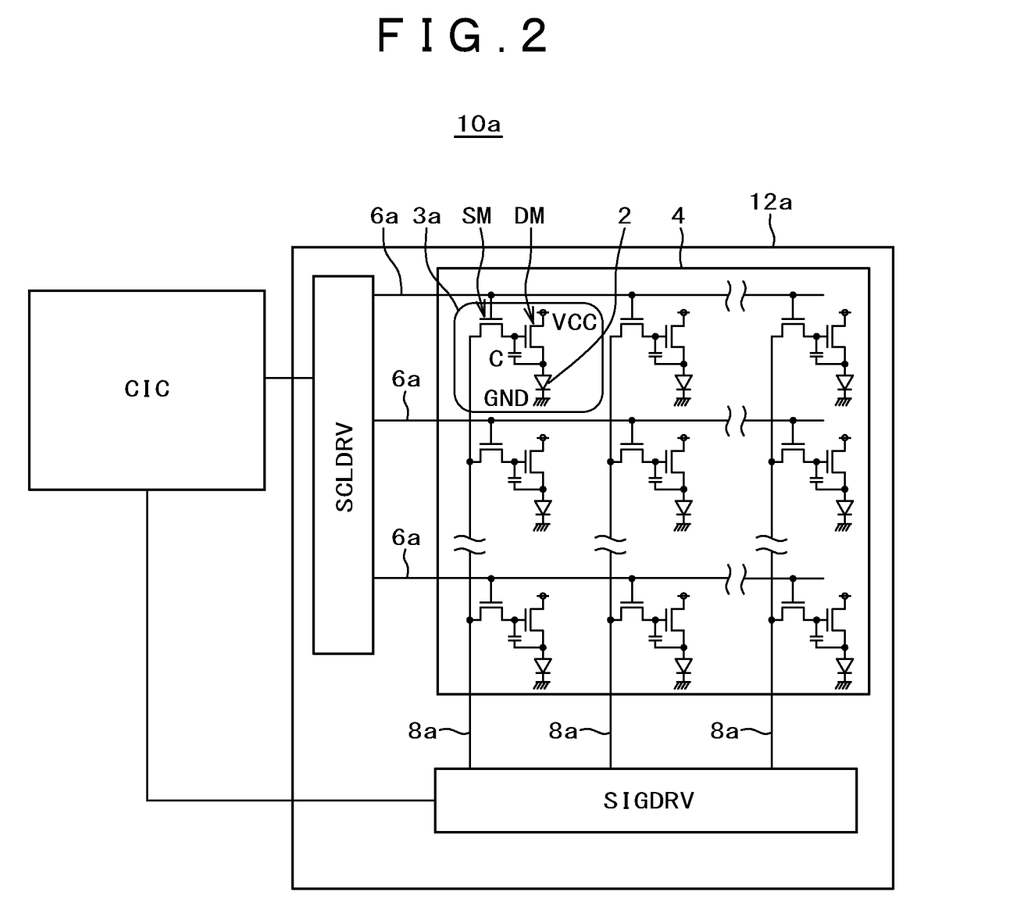
FIG. 2 is a view conceptually showing another configuration example of the optical light emitting device according to the embodiment.

FIG. 1 is a view conceptually showing an overall configuration example of an optical light emitting device according to an embodiment. FIG. 2 is a view conceptually showing another configuration example of the optical light emitting device according to the embodiment.

One configuration example of the optical light emitting device 10 according to the present embodiment is shown in FIG. 1. The optical light emitting device 10 of FIG. 1 is a display device or a lighting device. A display device such as an LED display or the like will hereinafter be described as a typical example.

The display device 10 has a display area 4 on a board (also called a circuit board) 12. A plurality of pixels 3 each including one LED element 2 as a light emitting element are arranged in a matrix form. Further, a plurality of row signal lines 6 for inputting an anode potential to an anode electrode of each LED element 2, and a plurality of column signal lines 8 for inputting a cathode potential to a cathode electrode of each LED element 2 are arranged in the display area 4. The row signal lines 6 and the column signal lines 8 are arranged so as to intersect with each other. A row driver RDRV to drive the row signal line 6 and a column driver CDRV to drive the column signal line 8 are provided at the peripheral edge of the board 12. The row driver RDRV and the column driver CDRV are electrically connected to a controller CIC. The controller CIC controls the operation of the row driver RDRV and the column driver CDRV.

The row driver RDRV sequentially selects (scans) the row signal lines 6 row by row, based on a control signal from the controller CIC and applies (turns ON) an anode voltage to the selected row signal line 6.

Based on the control signal from the controller CIC, the column driver CDRV sets, to the ground potential level (GND level, for example, 0V), the potential (cathode potential) of each column signal line 8 of the column of the LED elements 2 to be lit during the period of application (ON) of the anode voltage of the selected row signal line 6, and brings the potential (cathode potential) of each column signal line 8 of the column of the LED elements 2 to be unlit to a float state different from the ground potential level.

Gradation control is also possible by adjusting the length of the period in which the cathode of the LED element 2 is set to the GND level. This control is referred to as PWM (Pulse Width Modulation) control. By repeating it for all the rows of the row signal lines 6, it is possible to control the lighting and extinction of the LED elements 2 to perform desired image display or illumination dimming.

One configuration example of an optical light emitting device 10a according to the present embodiment is shown in FIG. 2. The optical light emitting device 10a of FIG. 2 is an active matrix type LED display.

The optical light emitting device 10a has a display area 4 on a board 12a. A plurality of pixels 3a each including an LED element 2, a selection transistor SM, a driver transistor DM, and a capacitive element C are arranged in matrix in the display area 4. In this example, each of the pixels 3a is configured to include the LED element 2, the selection transistor SM, the driver transistor DM, and the capacitive element C.

A plurality of scanning lines 6a each for applying a selection signal to a gate electrode of the selection transistor SM of the pixel 3a, and a plurality of signal lines 8a each for applying the potential of a signal value to a source or drain electrode of the selection transistor SM of the pixel 3a are arranged in the display area 4. The scanning lines 6a and the signal lines 8a are arranged to intersect with each other. A scanning line drive circuit SCLDRV which drives the scanning line 6a and a signal line driver SIGDRV which drives the signal line 8a are provided at the peripheral edge of the board 12a. The scanning line drive circuit SCLDRV and the signal line driver SIGDRV are connected to a controller CIC. The controller CIC controls the operation of the scanning line drive circuit SCLDRV and the signal line driver SIGDRV.

In the pixel 3a, a source-drain path (path between the source electrode and the drain electrode) of the selection transistor SM is connected between the signal line 8a and a gate electrode of the driver transistor DM. A source-drain path of the driver transistor DM is connected between a power supply wiring supplied with a power supply potential VCC and an anode electrode of the LED element 2. A cathode electrode of the LED element 2 is connected to a wiring supplied with a ground potential (GND). The capacitive element C is connected between the gate electrode of the driver transistor DM and the anode electrode of the LED element 2. That is, the capacitive element C is connected between the gate and source electrodes of the driver transistor DM.

In the pixel 3a, when the selection transistor SM is selected (turned ON) by the selection signal of the scanning line 6a, the voltage corresponding to the signal value of the signal line 8a is applied to the anode electrode side of the capacitive element C. Consequently, the potential across the capacitive element C is set depending on the signal value supplied from the signal line 8a. Then, the voltage between the gate and source of the driver transistor DM is set according to the voltage across the capacitive element C, so that the value of current flowing to the LED element 2 is controlled. Thus, it is possible to perform desired image display or illumination dimming.

Figure 3:
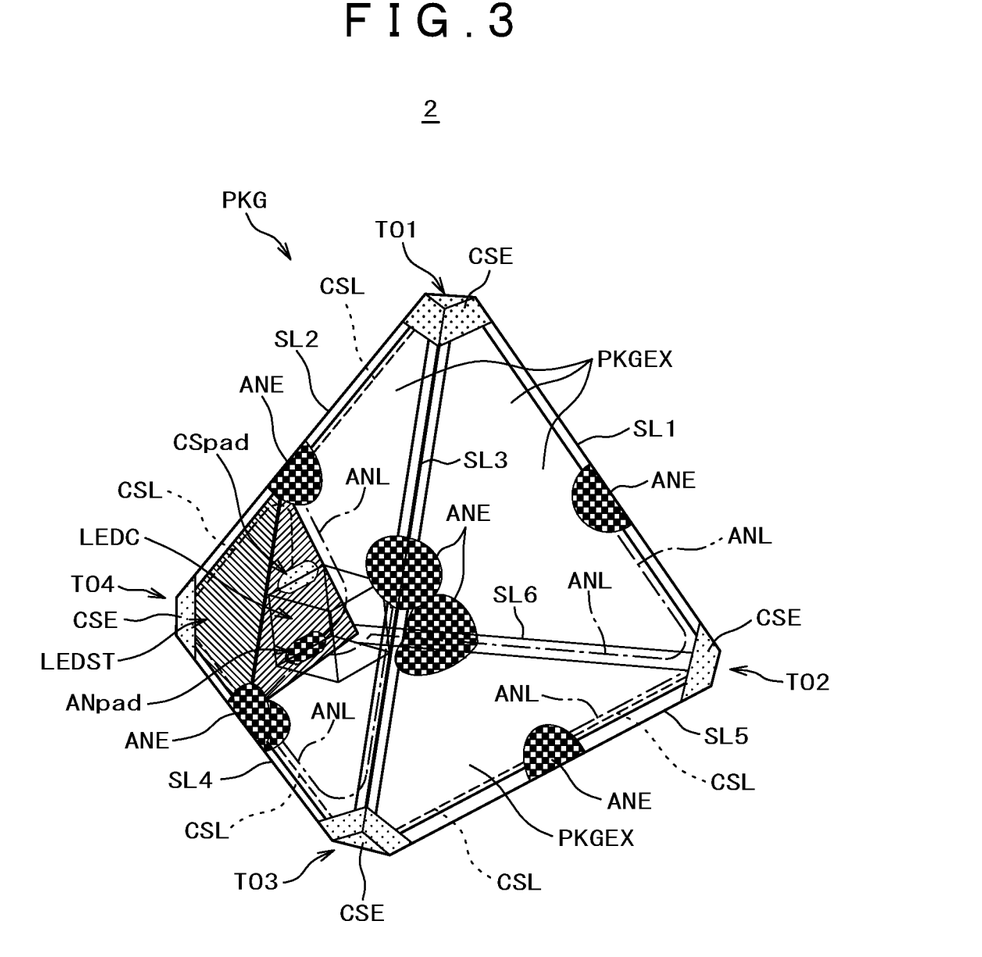
FIG. 3 is a perspective view for describing the structure of an LED element according to the embodiment.
Figure 4:
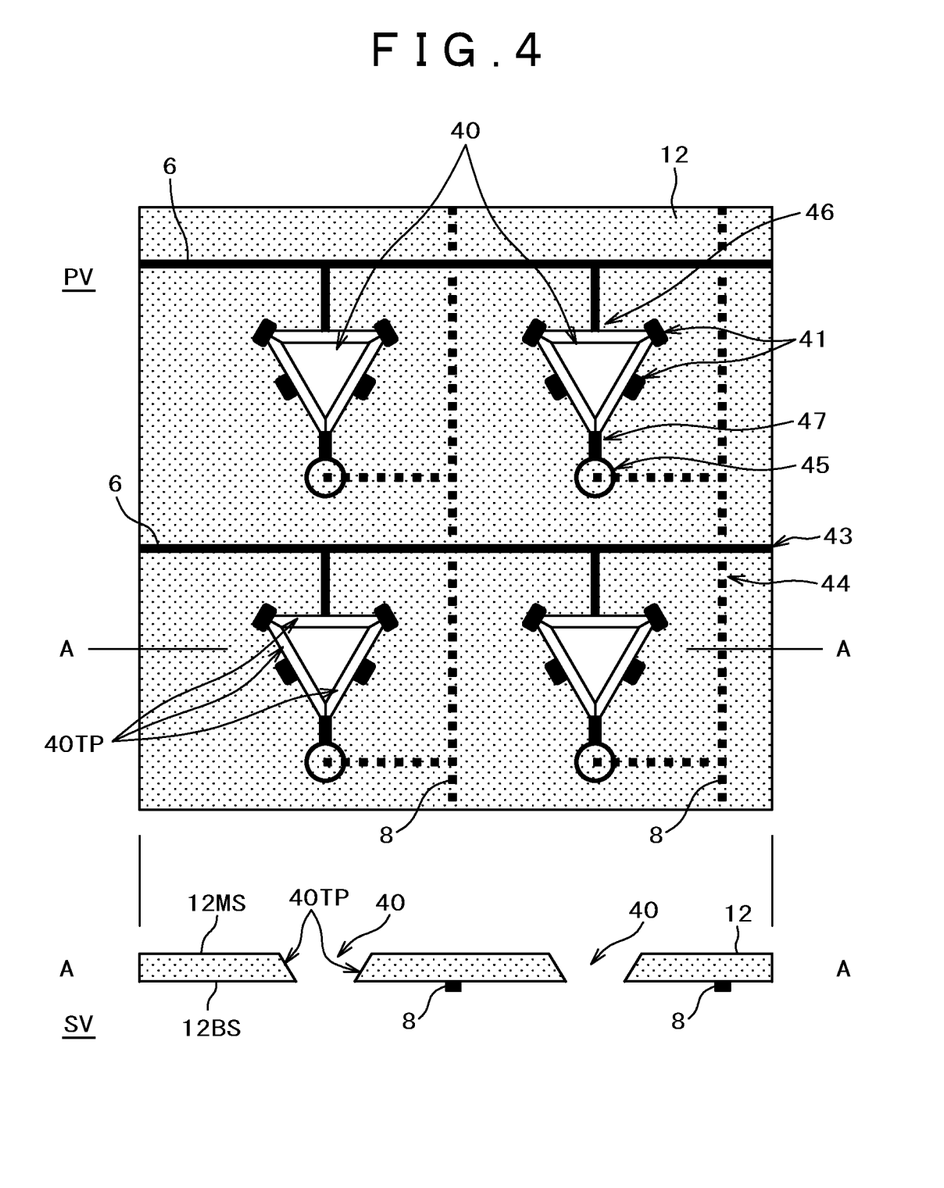
FIG. 4 is a view for describing a configuration example of a board in FIG. 1.

FIG. 3 is a perspective view for describing the structure of the LED element according to the embodiment. FIG. 4 is a view describing a configuration example of the board in FIG. 1.

As shown in FIG. 3, the LED element 2 as the light emitting element is configured as a regular polyhedral package PKG. In this example, the regular polyhedral package PKG is configured as a regular tetrahedral package PKG. The regular tetrahedral package PKG has four tops TO1 to TO4, four surfaces, and six sides SL1 to SL6. The four surfaces are configured as four exterior surfaces PKGEX each comprised of a transparent material (transparent member).

In the regular tetrahedral package PKG, an LED chip LEDC is placed on an installation stand LEDST being a fixing member. In this example, the installation stand LEDST is fixed and installed on the top TO4 side. Light emitted from the LED chip LEDC is made to be irradiated to the outside of the regular tetrahedral package PKG through the four transparent exterior surfaces PGKEX. The installation stand LEDST is comprised of a material having light shieldability. The installation stand LEDST may be comprised of a transparent material. In other words, the installation stand LEDST being the fixing member used to fix the LED chip LEDC is provided between one top (TO4)

of the regular tetrahedral package PKG and the LED chip LEDC as the light emitting element.

The LED chip LEDC has an anode pad ANpad and a cathode pad CSpad. In this example, the LED chip LEDC is formed to be a rectangular shaped chip, and the anode pad ANpad and the cathode pad CSpad are provided apart from each other so as to sandwich the bottom surface of the rectangular shaped chip on the side of the mounting surface of the LED chip LED of the installation stand LEDST.

The four tops TO1 to TO4 of the regular tetrahedral package PKG are provided with cathode terminals CSE each used as a first electrode. The four cathode terminals CSE are electrically connected to the cathode pad CSpad by cathode wirings CSL provided inside the regular tetrahedral package PKG.

Each of the six sides SL1 to SL6 of the regular tetrahedral package PKG is provided with an anode terminal ANE as a second electrode. That is, each of the six anode terminals ANE is disposed on the straight line (i.e., each of the six sides SL1 to SL6) connecting the two tops. The six anode terminals ANE are electrically connected to the anode pad ANpad by anode wirings ANL provided inside the regular tetrahedral package PKG. In this example, the four tops TO1 to TO4 at the six sides are arranged in regions located substantially in the centers of the sides SL1 to SL6. Incidentally, the cathode terminal CSE may be configured to be provided in a region substantially at the central position of each of the six sides SL1 to SL6, and the anode terminal ANE may be configured to be provided at each of the four tops TO1 to TO4.

Figure 5:
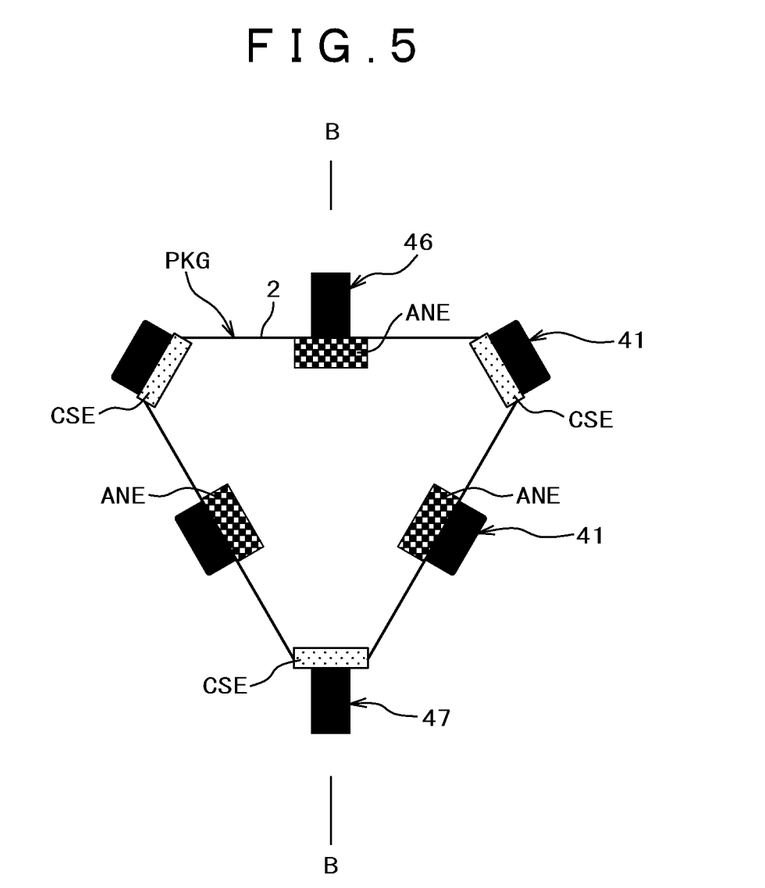
FIG. 5 is a conceptual plan view showing a state in which the LED element is mounted in a mounting hole.
Figure 6:
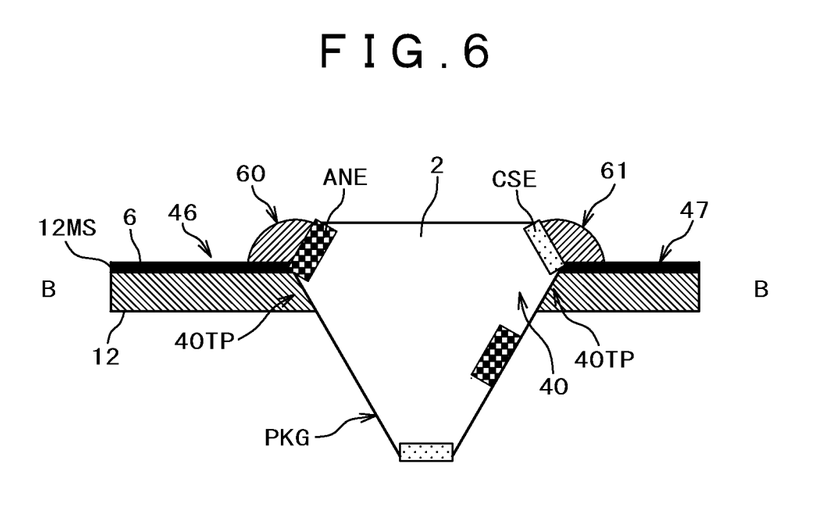
FIG. 6 is a conceptual cross-sectional view taken along line B-B of FIG. 5.

The configuration example of the board 12 in FIG. 1 will be described with reference to FIG. 4. FIG. 5 is a conceptual plan view showing a state in which the LED element 2 is mounted in a mounting hole. FIG. 6 is a conceptual cross-sectional view taken along line B-B of FIG. 5. A partially enlarged view of the board 12 before the LED element 2 is mounted is shown in FIG. 4 in plan view PV and sectional view SV. A cross-section taken along line A-A of the plan view PV corresponds to the sectional view SV.

As shown in FIG. 4, a plurality of mounting holes 40 in which a plurality of LED elements 2 are mounted are provided in the board 12. Each of the mounting holes 40 has a triangular shape in plan view. The triangular shape of the mounting hole 40 is configured so that the regular tetrahedral package PKG of the LED element 2 can be fitted therein. The board 12 has a front surface 12MS and a back surface 12BS. The mounting hole 40 is formed to be an opening penetrating from the front surface 12MS of the board 12 to the back surface 12BS thereof as shown in the sectional view SV. The opening of the mounting hole 40 is formed to have inclined surfaces (tapered surfaces) 40TP in sectional view. The upper side (front surface 12MS side) of the opening of the mounting hole 40 is made to be wide, and the lower side (back surface 12BS side) of the opening of the mounting hole 40 is made to be narrower than the upper side of the opening of the mounting hole 40. When the regular tetrahedral package PKG of the LED element 2 is fitted in the opening of the mounting hole 40, the three surfaces of the regular tetrahedral package PKG of the LED element 2 are configured to mate with the inclined surfaces (tapered surfaces) 40TP as the three surfaces of the opening of the mounting hole 40.

The board 12 is provided with a plurality of row signal lines 6 and a plurality of column signal lines 8. The row signal lines 6 are configured by wirings 43 indicated by solid lines provided on the front surface 12MS side of the board 12. The column signal lines 8 are configured by wirings 44 indicated by dotted lines provided on the back surface 12BS side of the board 12.

Next, as a representative, description will be made about the peripheral configuration of one mounting hole 40. The periphery of the mounting hole 40 on the front surface 12MS side includes: a connection wiring portion 46 for the anode terminal, which is electrically connected to an anode electrode ANE of the regular tetrahedral package PKG of the LED element 2; a connection wiring portion 47 for the cathode terminal, which is electrically connected to a cathode electrode CSE of the regular tetrahedral package PKG of the LED element 2; and a plurality of fixing terminals 41 such as solder. The connection wiring portion 46 for the anode terminal is electrically connected to the row signal line 6. The connection wiring portion 47 for the cathode terminal on the front surface 12MS side is electrically connected to the column signal line 8 provided on the back surface 12BS through a via electrode 45.

Next, with reference to FIGS. 5 and 6, description will be made about a state in which the LED element 2 is mounted in the mounting hole.

As shown in FIG. 5, when the regular tetrahedral package PKG of the LED element 2 is fitted into the mounting hole, the anode electrode ANE of the regular tetrahedral package PKG of the LED element 2 and the connection wiring portion 46 for the anode terminal are arranged close to each other. Therefore, as shown in FIG. 6, the anode electrode ANE and the connection wiring portion 46 for the anode terminal can be electrically connected to each other using connection solder 60. Further, since the cathode electrode CSE of the regular tetrahedral package PKG of the LED element 2 and the connection wiring portion 47 for the cathode terminal are arranged close to each other, it is possible to electrically connect the anode electrode ANE and the connection wiring portion 46 for the anode terminal using the connection solder 60 as shown in FIG. 6.

Further, as can be understood from FIGS. 5 and 6, when the regular tetrahedral package PKG of the LED element 2 is fitted into the opening of the mounting hole 40, the three surfaces of the regular tetrahedral package PKG of the LED element 2 are configured to mate with the three inclined surfaces (tapered surfaces) 40TP as the three surfaces of the opening of the mounting hole 40.

Here, the length of one side of the regular tetrahedral package PKG of the LED element 2 is, for example, 100 μm to 5 mm. Further, the arrangement pitch of the regular polyhedral packages PKG on the board 12 or the arrangement pitch of the mounting holes on the board 12 is, for example, 100 μm to 5 mm.

Figure 7:
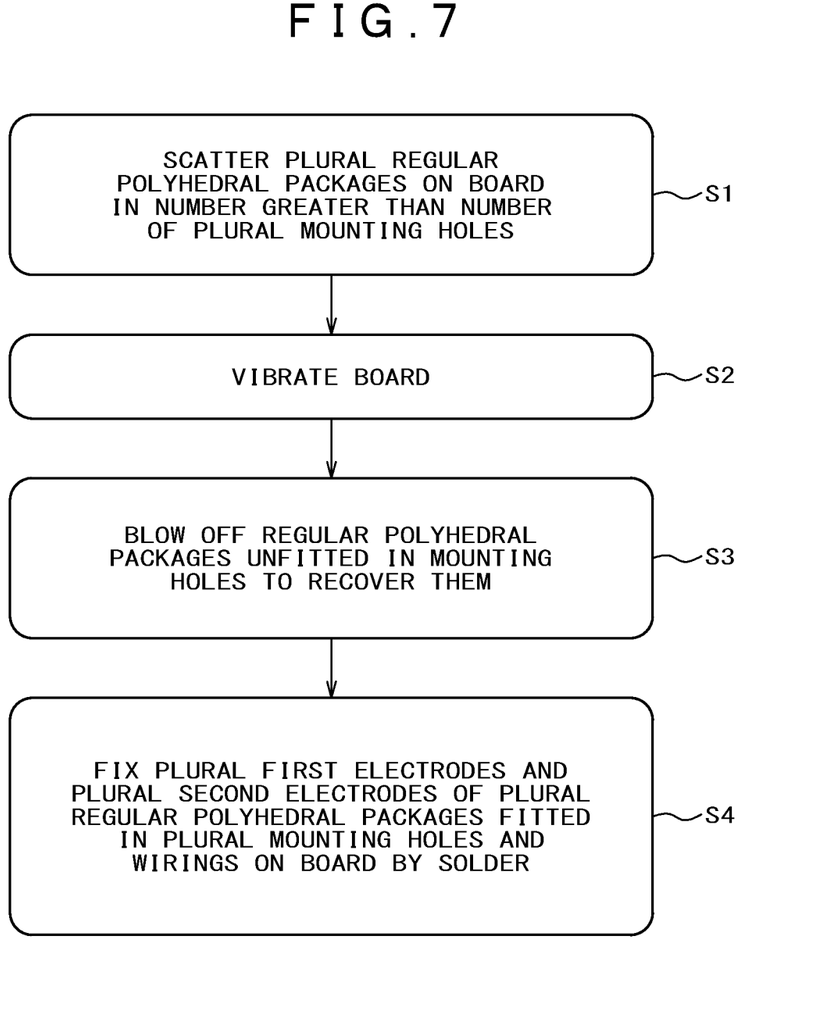
FIG. 7 is a flowchart describing a method of manufacturing the optical light emitting device according to the embodiment.
Figure 8:
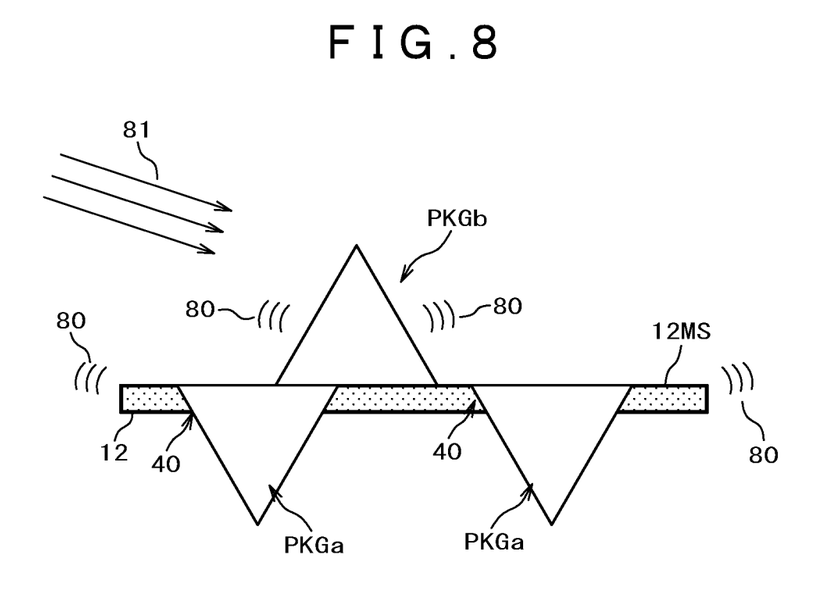
FIG. 8 is a conceptual view describing a step of fitting a regular tetrahedral package PKG of an LED element in an opening of a mounting hole and its recovering step.

Next, a method of manufacturing an optical light emitting device in which a large number of identical parts such as the LED elements 2 are arranged in the mounting holes 40 of the board 12 will be described with reference to FIGS. 7 and 8. FIG. 7 is a flowchart describing the method of manufacturing the optical light emitting device according to the embodiment. FIG. 8 is a conceptual view describing a step of fitting the regular tetrahedral package PKG of the LED element 2 into the opening of the mounting hole 40 and its recovering step.

First, a plurality of regular tetrahedral packages PKG of LED elements 2 and a board 12 having a plurality of mounting holes 40 are provided. The number of the regular tetrahedral packages PKG of the LED elements 2 to be provided is greater than or equal to the number of the mounting holes 40 provided in the board 12. Thus, since the LED elements 2 can be fitted in all of this number of mounting holes 40, it is possible to reduce the generation rate of mounting defects.

(Step S1: First Step)

A plurality of regular polyhedral packages PKG of LED elements 2 are scattered on the main surface side (12MS) of the board 12. The regular polyhedral packages PKG of the LED elements 2 to be scattered are scattered in a number greater than the number of the mounting holes 40.

(Step S2: Second Step)

In the state of Step S1, the board 12 is vibrated as indicated by 80 using a board vibrating device (refer to FIG. 8). Consequently, the regular polyhedral packages PKG of the LED elements 2 are fitted in the mounting holes 40 (refer to FIG. 8: PKGa). The regular polyhedral packages PKG (PKGb) of the LED elements 2 that do not fit into the mounting holes 40 remain on the main surface side (12MS) of the board 12. When the LED elements 2 are fitted into all the mounting holes 40 provided in the board 12 after confirmation by imaging or image recognition, the flow proceeds to Step S3.

(Step S3: Third Step)

In Step S2, the regular polyhedral packages PKG (PKGb) of the LED elements 2 unfitted or free from fitting in the mounting holes 40 remain on the main surface side (12MS) of the board 12. In order to recover these, the main surface side (12MS) of the board 12 is blown off with wind 81 generated by a blow device or the like (refer to FIG. 8). Consequently, the regular polyhedral packages PKG of the LED elements 2 which are unfitted or free from fitting and remaining on the main surface side (12MS) of the board 12 are recovered, for example, in a recovery bag or the like. After the completion of the recovery, the flow proceeds to Step S4. Since the recovered regular polyhedral packages PKG of LED elements 2 which are unfitted or free from fitting can be reused, they are used in the next Step S1, for example.

(Step S4: Fourth Step)

A plurality of first electrodes (cathode electrodes) and a plurality of second electrodes (anode electrodes) of the regular polyhedral packages PKG of the LED elements 2 fitted in the mounting holes 40, and wirings (the connection wiring portion 46 for the anode terminal and the connection wiring portion 47 for the cathode terminal) on the board 12 are fixed by solder 60 for connection using solder reflow or the like.

According to the embodiment, in a step of mounting a large number of identical parts (LED elements 2) such as an LED display, the board 12 is vibrated without using a mounter device, to fit the large number of LED elements 2 into the mounting holes 40 of the board 12 and then place them thereon. Therefore, it is possible to shorten working time. This eliminates restrictions on the production quantity of products such as an LED display, etc. and also enables the generation rate of mounting defects to be reduced.

(First Modification)

Figure 9:
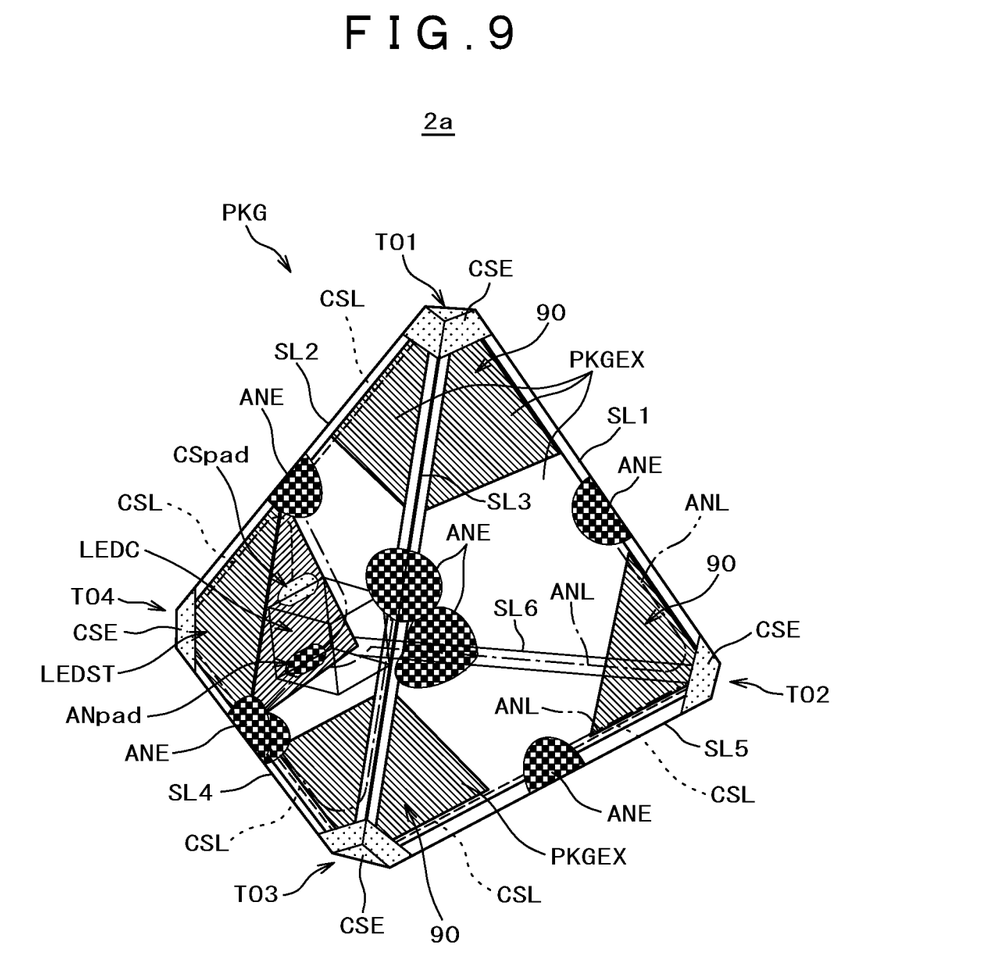
FIG. 9 is a perspective view for describing the structure of an LED element according to a first modification.

FIG. 9 is a perspective view for describing the structure of an LED element according to a first modification. A regular polyhedral package PKG of an LED element 2a shown in FIG. 9 is different from the regular polyhedral package PKG of the LED element 2 of FIG. 3 in that, in order to reduce the difference in the amount of light due to the mounting orientation, an installation stand (fixing member) 90 having the same configuration as the installation stand (fixing member) LEDST for the LED chip LEDC is added to the other three tops, and each top is provided with the installation stand. Since other configurations and effects of the regular polyhedral package PKG of the LED element 2a in FIG. 9 are the same as those of the regular polyhedral package PKG of the LED element 2 in FIG. 3, dual description thereof will be omitted.

When the installation stand LEDST is comprised of a material having light shieldability, the installation stand 90 is also comprised of a material having light shieldability. That is, the installation stand 90 has a member having the same transparency as that of the installation stand LEDST.

Thus, the difference in the amount of light depending on the mounting orientation of the regular polyhedral package PKG of the LED element 2 can be greatly improved. Incidentally, further, an LED chip LEDC may be mounted on each installation stand 90. Even in this configuration, it is possible to improve the difference in the amount of light depending on the mounting orientation of the regular polyhedral package PKG of the LED element 2.

(Second Modification)

Figure 10:
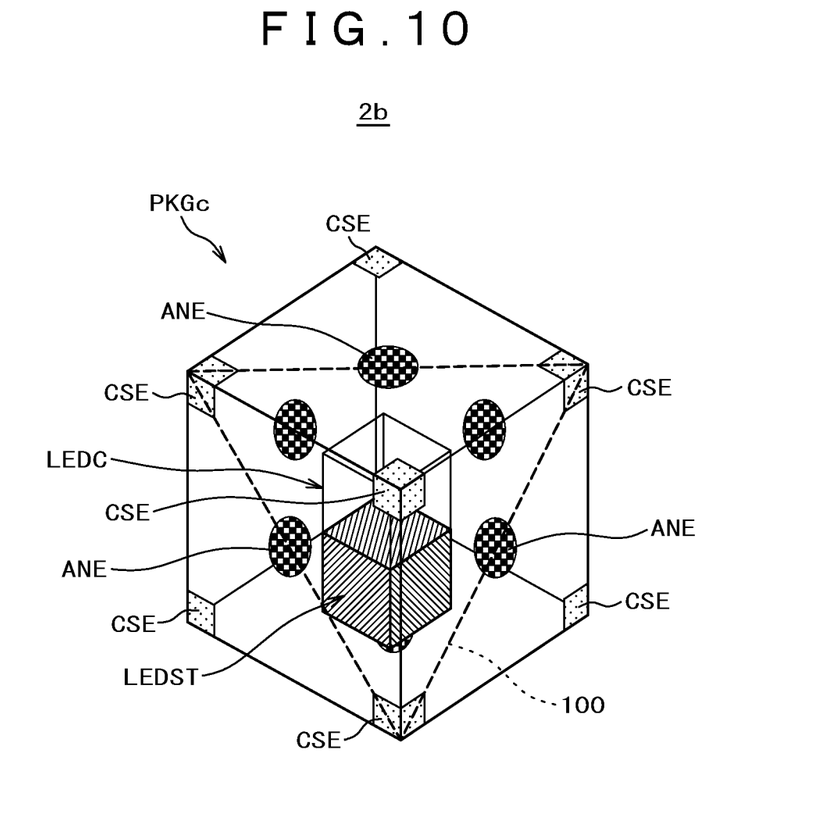
FIG. 10 is a conceptual perspective view for describing the structure of an LED element according to a second modification.
Figure 11:
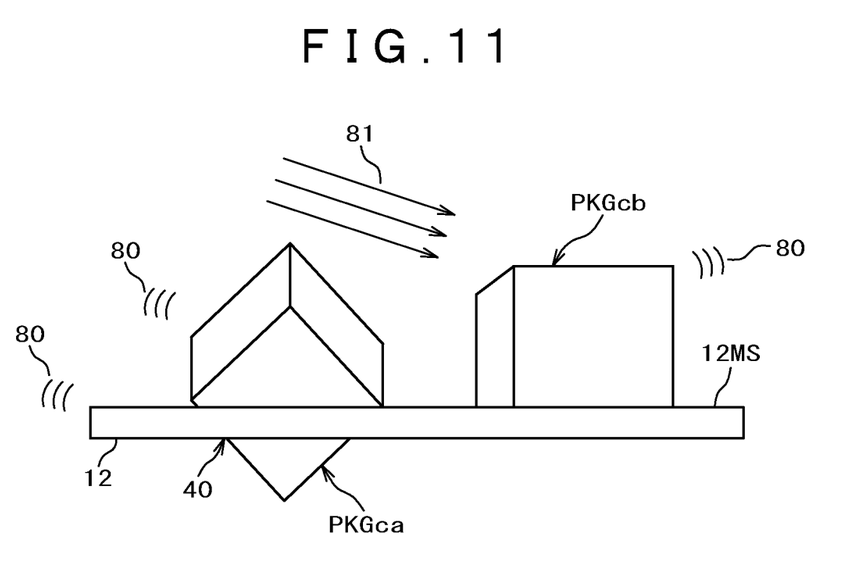
FIG. 11 is a conceptual view describing a step of fitting a regular hexahedral (cubic) package of the LED element according to the second modification into an opening of a mounting hole and its recovering step.

FIG. 10 is a conceptual perspective view for describing the structure of an LED element according to a second modification. FIG. 11 is a conceptual view describing a step of fitting a regular hexahedral (cubic) package of the LED element according to the second modification into an opening of a mounting hole and its recovering step.

Although the regular tetrahedral package PKG of the LED element 2 is shown in FIG. 3, the LED element 2b according to the second modification may be configured as a regular hexahedral (cubic) package PKGc as shown in FIG. 10.

The regular hexahedral package PKGc has six tops, six surfaces, and eight sides. The six surfaces are taken to be exterior surfaces which are comprised of transparent members. Each of the six tops is provided with one cathode terminal CSE (six cathode terminals CSE in total). Each of central portions (positions of the intersection parts of the diagonal lines connecting the two pairs of diagonal angles of the corresponding surfaces) of the six surfaces is provided with one anode terminal ANE (six anode terminals ANE in total).

An LED chip LEDC is placed on an installation stand LEDST. That is, the installation stand LEDST is provided between one surface of the regular hexahedral (cubic) package PKGc and the LED chip LEDC as the light emitting element. The material for the installation stand LEDST may be a transparent material or may be a light shielding material. Incidentally, a member having the same transparency as that of the installation stand LEDST can be provided in each of the centers of the remaining five surfaces different from the one surface of the regular hexahedral (cubic) package PKGc provided with the installation stand LEDST. This makes it possible to improve the difference in the amount of light due to the mounting orientation of the regular hexahedral package PKGc of the LED element 2b, as in the first modification.

In FIG. 10, the description of connection wirings (corresponding to ANL in FIG. 3) provided between an anode pad ANpad of the LED chip LEDC and the six anode terminals ANE, and the description of connection wirings (corresponding to CSL in FIG. 3) provided between a cathode pad CSpad of the LED chip LEDC and the six cathode terminals CSE are omitted to avoid complication of the drawing.

The regular hexahedral package PKGc of the LED element 2b can be mounted on the board 12 having the mounting holes 40 described in FIG. 4. A dotted line 100 of an equilateral triangle shown in FIG. 10 representatively indicates an upper side portion of a contact portion with the board when the regular hexahedral package PKGc of the LED element 2b is fitted in the mounting hole 40. In this example as well, the three surfaces of the regular hexahedral package PKGb of the LED element 2b are put (fitted) in contact with the three inclined surfaces (tapered surfaces) TP of the mounting hole 40.

The configuration of mounting the regular hexahedral package PKGc of the LED element 2b on the board 12 having the mounting holes 40 is the same as in FIGS. 5 and 6. Incidentally, a method of mounting the regular hexahedral package PKGc of the LED element 2b on the board 12 having the mounting holes 40 can utilize the configuration explained in FIGS. 7 and 8. In other words, as shown in FIG. 11, a plurality of regular hexahedral packages PKGc of LED elements 2b are scattered on the main surface side (12MS) of the board 12. The board 12 is vibrated as indicated by 80 using a board vibrating device. Consequently, the regular polyhedral packages PKGc of the LED elements 2b are fitted in the mounting holes 40 (PKGca) The regular hexahedral packages PKGc (PKGcb) of the LED elements 2b that do not fit into the mounting holes 40 remain on the main surface side (12MS) of the board 12. In order to recover these, the main surface side (12MS) of the board 12 is blown off with wind 81 generated by a blow device or the like. Consequently, the regular hexahedral packages PKGcb of the LED elements 2b which are unfitted or free from fitting and remaining on the main surface side (12MS) of the board 12 are recovered, for example, in a recovery bag or the like.

Even with the configuration of the second modification, the same effects as those of the embodiment can be obtained.

It is understood that those skilled in the art can conceive of various kinds of change examples and modified examples within the scope of the idea of the present invention, and they also belong to the scope of the present invention. For example, appropriate additions, deletions, or design changes of components, or adding or omitting steps or changes of conditions thereof to the above-described embodiments by those skilled in the art are also included within the scope of the present invention as long as they have the gist of the present invention.

Further, other operations and effects brought about by the aspects described in the present embodiment that are obvious from the description of the present specification or that can be appropriately conceived by those skilled in the art are naturally understood to be brought about by the present invention.

Various inventions can be formed by appropriately combining a plurality of components disclosed in the above embodiments. For example, some components may be omitted from all the components shown in the embodiments. Further, components in different embodiments may be combined as appropriate.

What is claimed is:

1. An optical light emitting device, comprising:
    packages of a plurality of regular polyhedra each having a light emitting element; and
    a board having a plurality of mounting holes fitted with three surfaces of the regular polyhedral packages,
    wherein the exterior of each of the regular polyhedra in the regular polyhedral packages is comprised of a transparent member, and
    wherein each of the regular polyhedral packages includes:
    first electrodes each provided at each top; and
    second electrodes each provided on a straight line connecting the two tops,
    wherein each of the first electrodes is connected to one electrode of the light emitting element, and
    wherein each of the second electrodes is connected to the other electrode of the light emitting element.

2. The optical light emitting device according to claim 1, wherein the one electrode and the other electrode of the light emitting element are an anode and a cathode respectively.

3. The optical light emitting device according to claim 1,
    wherein the length of one side of the regular polyhedron is 100 μm to 5 mm, and
    wherein the arrangement pith of the regular polyhedral packages on the board is 100 μm to 5 mm.

4. The optical light emitting device according to claim 1, wherein the regular polyhedron is a regular tetrahedron.

5. The optical light emitting device according to claim 4, wherein the second electrode is provided on each side of the regular polyhedron.

6. The optical light emitting device according to claim 4, wherein a fixing member fixing the light emitting element is provided between one top of the regular tetrahedron and the light emitting element.

7. The optical light emitting device according to claim 6, wherein a member having the same transparency as that of the fixing member is provided at each of the remaining tops of the regular tetrahedron.

8. The optical light emitting device according to claim 6, wherein the fixing member has light shieldability.

9. The optical light emitting device according to claim 1, wherein the regular polyhedron is a cube.

10. The optical light emitting device according to claim 9, wherein the second electrodes are respectively provided at the center of each surface of the cube.

11. The optical light emitting device according to claim 9, wherein a fixing member fixing the light emitting element is provided between one surface of the cube and the light emitting element.

12. The optical light emitting device according to claim 11, wherein a member having the same transparency as that of the fixing member is provided at the center of each of the remaining surfaces of the cube.

13. The optical light emitting device according to claim 11, wherein the fixing member has light shieldability.

14. A method of manufacturing the optical light emitting device according to claim 1, comprising:
    a first step of scattering the regular polyhedral packages on the board in a number greater than the number of the mounting holes;
    a second step of vibrating the board;
    a third step of blowing off the regular polyhedral packages unfitted or free from fitting in the mounting holes to recover the packages; and
    a fourth step of fixing the first electrodes and second electrodes of the regular polyhedral packages fitted into the mounting holes and wirings on the board by solder.

15. An optical light emitting element, comprising:
    a light emitting element; and
    a package of a translucent regular polyhedron storing the light emitting element therein,
    wherein a first electrode is provided at each of tops of the regular polyhedral package,
    wherein a second electrode is provided on each of straight lines each connecting the two tops of the regular polyhedral package,
    wherein the first electrodes are connected to one electrode of the light emitting element, and
    wherein the second electrodes are connected to the other electrode of the light emitting element.

16. The optical light emitting element according to claim 15, wherein the one electrode and the other electrode of the light emitting element are an anode and a cathode respectively.

17. The optical light emitting element according to claim 15, wherein the length of one side of the regular polyhedron is 100 μm to 5 mm.

18. The optical light emitting element according to claim 15, wherein the regular polyhedron is a regular tetrahedron, and the second electrodes are provided on each side of the regular polyhedron.

19. The optical light emitting element according to claim 18, wherein a fixing member fixing the light emitting element is provided between one top of the regular tetrahedron and the light emitting element.

20. The optical light emitting element according to claim 19, wherein fixing members having light shieldability are provided at all tops of the regular tetrahedron.

* * * * *